US011107956B2

(12) United States Patent
Tangring et al.

(10) Patent No.: US 11,107,956 B2
(45) Date of Patent: Aug. 31, 2021

(54) PRODUCTION OF RADIATION-EMITTING SEMICONDUCTOR COMPONENTS (71) Applicant: OSRAM Opto Semiconductors GmbH, Regensburg (DE)

(72) Inventors: Ivar Tangring, Regensburg (DE); Markus Richter, Burglengenfeld (DE)

(73) Assignee: OSRAM OLED GmbH, Regensburg (DE)

( * ) Notice: Subject to any disclaimer, the term of this patent is extended or adjusted under 35 U.S.C. 154(b) by 114 days.

(21) Appl. No.: 16/345,287

(22) PCT Filed: Nov. 2, 2017

(86) PCT No.: PCT/EP2017/078080
§ 371 (c)(1),
(2) Date: Apr. 26, 2019

(87) PCT Pub. No.: WO2018/083187
PCT Pub. Date: May 11, 2018

(65) Prior Publication Data
US 2019/0273191 A1    Sep. 5, 2019

(30) Foreign Application Priority Data
Nov. 4, 2016   (DE) ..................... 10 2016 121 099.4

(51) Int. Cl.
*H01L 33/60*    (2010.01)
*H01L 33/50*    (2010.01)
(Continued)

(52) U.S. Cl.
CPC ........ *H01L 33/505* (2013.01); *H01L 33/0095* (2013.01); *H01L 33/502* (2013.01);
(Continued)

(58) Field of Classification Search
CPC ... H01L 33/00; H01L 33/009; H01L 33/0095; H01L 33/46; H01L 33/50; H01L 33/502;
(Continued)

(56) References Cited

U.S. PATENT DOCUMENTS 9,287,469 B2 *  3/2016  Chakraborty ......... H01L 33/501
2012/0302124 A1  11/2012  Imazu
(Continued)

FOREIGN PATENT DOCUMENTS

| DE | 11 2011 100 376 T5 | 11/2012 |
| WO | 2014/173670 A1 | 10/2014 |
| WO | 2017/062116 A1 | 4/2017 |

OTHER PUBLICATIONS

German Search Report dated Sep. 27, 2017, of corresponding German Application No. 10 2016 121 099.4.

*Primary Examiner* — Monica D Harrison
(74) *Attorney, Agent, or Firm* — DLA Piper LLP (US)

(57) ABSTRACT

A method of producing radiation-emitting semiconductor components includes arranging radiation-emitting semiconductor chips on a conversion layer; thickening the conversion layer next to and between the semiconductor chips by applying a filling compound containing phosphor, wherein the thickened conversion layer adjoins a front side and side faces of the semiconductor chips; forming a reflective layer on the conversion layer and on the semiconductor chips in a region of a rear side of the semiconductor chips, wherein a rear-side surface of the contacts of the semiconductor chips remains uncovered; and severing the reflective layer and the conversion layer to form singulated semiconductor components including a single semiconductor chip, a part of the conversion layer arranged on the front side and on the side faces of the semiconductor chip, and a part of the reflective
(Continued)

layer arranged in the region of the rear side on the semiconductor chip and on the conversion layer.

20 Claims, 6 Drawing Sheets (51) Int. Cl.
*H01L 33/00* (2010.01)
*H01L 33/62* (2010.01)
*H01L 33/46* (2010.01)

(52) U.S. Cl.
CPC .............. H01L 33/60 (2013.01); H01L 33/62 (2013.01); *H01L 33/46* (2013.01); *H01L 2933/0025* (2013.01); *H01L 2933/0041* (2013.01); *H01L 2933/0058* (2013.01)

(58) Field of Classification Search
CPC ....... H01L 33/505; H01L 33/60; H01L 33/62; H01L 2933/00; H01L 2933/002; H01L 2933/0025; H01L 2933/004; H01L 2933/0041; H01L 2933/005; H01L 2933/0058
USPC ............................................................ 257/98
See application file for complete search history.

(56) References Cited

U.S. PATENT DOCUMENTS

| 2014/0027804 | A1 | 1/2014 | Yoneda et al. |
| 2014/0367633 | A1* | 12/2014 | Bibl .................... H01L 25/0753 257/13 |
| 2015/0207046 | A1* | 7/2015 | Ikegami ................ H01L 33/505 257/98 |
| 2015/0221623 | A1* | 8/2015 | Tischler .................. H01L 33/58 257/89 |
| 2015/0311405 | A1 | 10/2015 | Oyamada et al. |
| 2016/0087161 | A1 | 3/2016 | Wirth et al. |
| 2017/0005238 | A1* | 1/2017 | Hung .................... H01L 21/561 |

* cited by examiner

PRODUCTION OF RADIATION-EMITTING SEMICONDUCTOR COMPONENTS

TECHNICAL FIELD

This disclosure relates to a method of producing radiation-emitting semiconductor components and a radiation-emitting semiconductor component.

BACKGROUND

Semiconductor light sources are increasingly used nowadays in the field of general lighting. The light sources may be realized in the form of CSP LEDs (CSP: Chip Size Package; LED: Light Emitting Diode). The latter are semiconductor components comprising a single radiation-emitting semiconductor chip and a conversion material for radiation conversion that substantially comprise the size of the semiconductor chip.

To produce CSP LEDs, the semiconductor chips may be potted with a conversion compound. In that procedure the color locus of the generatable light radiation may only be ascertained at the end of the production process. This may be associated with losses of yield. Laminating a conversion film onto the semiconductor chips is also possible. The film may be precharacterized and the yield may thereby be increased. What is disadvantageous, however, is that the film is secured on the semiconductor chips by adhesive. Losses in terms of the lifetime and/or the performance of the semiconductor components may therefore occur. A conversion film comprising a bi-stage material may alternatively be used. Such a partly crosslinked film may be arranged directly on semiconductor chips and be made to bond adhesively in a heating process. However, bi-stage films are expensive and comprise a short lifetime.

It could therefore be helpful to provide an improved method of producing radiation-emitting semiconductor components and an improved radiation-emitting semiconductor component.

SUMMARY

We provide a method of producing radiation-emitting semiconductor components including providing a conversion layer containing phosphor; arranging radiation-emitting semiconductor chips on the conversion layer, wherein the semiconductor chips are arranged by a front side on the conversion layer, and the semiconductor chips include contacts at a rear side; thickening the conversion layer next to and between the semiconductor chips by applying a filling compound containing phosphor, wherein the thickened conversion layer adjoins the front side and side faces of the semiconductor chips; forming a reflective layer on the conversion layer and on the semiconductor chips in a region of the rear side of the semiconductor chips, wherein a rear-side surface of the contacts of the semiconductor chips remains uncovered; and severing the reflective layer and the conversion layer to form singulated semiconductor components including a single semiconductor chip, a part of the conversion layer arranged on the front side and on the side faces of the semiconductor chip, and a part of the reflective layer arranged in the region of the rear side on the semiconductor chip and on the conversion layer.

We also provide a radiation-emitting semiconductor component including a single radiation-emitting semiconductor chip, wherein the semiconductor chip includes contacts at a rear side; a conversion layer containing phosphor and arranged on a front side and on side faces of the semiconductor chip; and a reflective layer arranged in the region of the rear side on the semiconductor chip and on the conversion layer, wherein a rear-side surface of the contacts of the semiconductor chip is not covered with the reflective layer.

We further provide a radiation-emitting semiconductor component including a single radiation-emitting semiconductor chip, wherein the semiconductor chip includes contacts at a rear side; a conversion layer containing phosphor and arranged on a front side and on side faces of the semiconductor chip; and a reflective layer arranged in the region of the rear side on the semiconductor chip and on the conversion layer, wherein a rear-side surface of the contacts of the semiconductor chip is not covered with the reflective layer, the conversion layer includes a matrix material and phosphor particles, a layer thickness of the conversion layer in a region of the side faces of the semiconductor chip is greater than a layer thickness of the conversion layer in the region of the front side of the semiconductor chip, and the conversion layer additionally includes a transparent particulate filler in the region of the side faces of the semiconductor chip.

LIST OF REFERENCE SIGNS 100 semiconductor component
110 conversion layer 111 filling compound
120 matrix material
121 phosphor particle
122 transparent particle
130 auxiliary carrier
140 semiconductor chip
141 front side
142 rear side
143 side face
145 contact
150 reflective layer
160 saw blade
171 layer thickness
173 layer thickness
181 concave curvature
182 convex curvature

DETAILED DESCRIPTION

We provide a method of producing radiation-emitting semiconductor components. The method comprises providing a conversion layer containing phosphor, and arranging radiation-emitting semiconductor chips on the conversion layer. The semiconductor chips are arranged by a front side on the conversion layer. The semiconductor chips comprise contacts at a rear side. A further step of the method is thickening the conversion layer next to and between the semiconductor chips by applying a filling compound containing phosphor. The thickened conversion layer adjoins the front side and side faces of the semiconductor chips. The method furthermore comprises forming a reflective layer on the conversion layer and on the semiconductor chips in the region of the rear side of the semiconductor chips. A rear-side surface of the contacts of the semiconductor chips remains uncovered. Furthermore, the reflective layer and the conversion layer are severed to form singulated semiconductor components. The semiconductor components comprise a single semiconductor chip, a part of the conversion layer arranged on the front side and on the side faces of the semiconductor chip, and a part of the reflective layer arranged in the region of the rear side on the semiconductor chip and on the conversion layer.

Radiation-emitting semiconductor chips comprising a front side, a rear side opposite to the front side, and lateral side faces extending between the front side and the rear side are used in the method. The semiconductor chips comprise contacts at the rear side. The semiconductor chips may be electrically contacted and thereby supplied with electrical energy via the contacts.

In the method, the semiconductor chips are arranged by the front sides thereof on a provided conversion layer, and regions next to and between the semiconductor chips are filled with a filling compound containing phosphor to thicken the conversion layer. Furthermore, a reflective layer is formed in the region of the rear side of the semiconductor chips, and the component assemblage formed in this way is singulated into separate radiation-emitting semiconductor components by severing the reflective layer and the conversion layer between the semiconductor chips. These steps may be carried out in the order specified above.

During operation of the radiation-emitting semiconductor components, the radiation emitted by the associated semiconductor chip may be at least partly converted with the aid of the conversion layer. The semiconductor components may be configured, for example, to generate a primary blue light radiation. The primary light radiation may be at least partly converted with the aid of the conversion layer. As a result, by way of example, a white light radiation may be generated and emitted via the conversion layer of the semiconductor components.

The reflective layer present at the rear side affords the possibility of suppressing a rear-side radiation emission during operation of the semiconductor components. In this way, the semiconductor components may be distinguished by a high luminous efficiency.

The use of adhesive between the conversion layer and the semiconductor chips is obviated in the radiation-emitting semiconductor components. Instead, the semiconductor components are produced such that the conversion layer directly adjoins the semiconductor chips and covers the front sides and side faces thereof. In this way, the semiconductor components may comprise a long lifetime, and optical properties of the semiconductor components may be promoted.

The conversion layer provided at the beginning of the method and the filling compound used to thicken the conversion layer may comprise a radiation-transmissive basic material, referred to hereinafter as matrix material, and phosphor particles that bring about the radiation conversion. Thickening the conversion layer next to and between the semiconductor chips by applying the filling compound makes it possible to form the conversion layer with a high degree of filling of phosphor particles in these regions. The initial conversion layer may also be provided with a high degree of filling of phosphor particles. The method thus affords the possibility of producing radiation-emitting semiconductor components in which the conversion layer is formed in a highly concentrated manner and comprises a high phosphor content and hence particle content.

This affords the possibility of producing the radiation-emitting semiconductor components with a small thickness of the conversion layer. This is because, as a result of the high packing density of phosphor particles, a sufficient radiation conversion may be achieved even with a small layer thickness. This is associated with a material and hence cost saving.

A configuration of the radiation-emitting semiconductor components comprising a conversion layer comprising a high particle content and a small layer thickness furthermore enables efficient heat dissipation for the conversion layer during operation of the semiconductor components. Therefore, the semiconductor components may be distinguished by a high robustness, and a long lifetime of the semiconductor components may be further promoted. The efficient heat dissipation furthermore makes it possible to operate the semiconductor components with a high power density.

A more specific description is given below of further possible details and examples that may be considered for the method and the semiconductor components produced in accordance with the method.

The radiation-emitting semiconductor components may be CSP components, the size of which substantially corresponds to the size of the associated semiconductor chips. Furthermore, the semiconductor components may be used in general lighting.

The semiconductor chips of the semiconductor components may be LED chips. In one example, the semiconductor chips used are volume emitting flip-chips. In this configuration, the primary light radiation may be emitted via the front side and via the side faces of the semiconductor chips, and be at least partly converted by the conversion layer present at these locations. The semiconductor chips may comprise a radiation-transmissive chip substrate comprising sapphire, for example, that constitutes the front side of the semiconductor chips. A semiconductor layer sequence comprising an active zone that generates radiation may be arranged at the rear side on the chip substrate. The rear-side contacts may be arranged on the semiconductor layer sequence.

The conversion layer provided at the beginning of the method may be planar. The matrix material of this conversion layer, and also that of the filling compound used to thicken the conversion layer, may be a plastics material such as, for example, a silicone material or an epoxy material. The matrix material may constitute the non-particle content of the conversion layer. The matrix material may contain one type of phosphor particles, or different types of phosphor particles.

It is possible for the conversion layer provided at the beginning and the filling compound used to thicken to comprise a corresponding material constitution, i.e. the same matrix material and the same phosphor particles. A radiation emission with a high color locus homogeneity over different emission angles during operation of the semiconductor components is possible in this way.

Thickening the conversion layer by applying the filling compound may be carried out such that the conversion layer extends as far as rear-side edges of the semiconductor chips.

With the aid of the reflective layer subsequently formed, which may serve as a reflector in the radiation-emitting semiconductor components, it is possible to prevent a rear-side radiation emission during operation of the semiconductor components. Suitably thickening the conversion layer makes it possible for an controlled reflector structure to be made available. In this example, the procedure adopted may be as described below.

In a further example, the thickened conversion layer is formed such that a surface of the conversion layer between the semiconductor chips is concavely curved. In this way, it is possible to fabricate radiation-emitting semiconductor components in which the reflective layer comprises an outwardly increasing layer thickness in a lateral direction in a region in which the reflective layer adjoins the conversion layer. In this configuration, the interface between the conversion layer and the reflective layer may extend obliquely or substantially obliquely with respect to a front and rear side of the semiconductor components. This configuration makes it possible to reduce lateral radiation emission during operation of the semiconductor components and improve the luminous efficiency as a result.

In a further example, the filling compound comprises a solvent that evaporates after applying the filling compound. This configuration promotes formation of the conversion layer with a high particle content and a high packing density of phosphor particles. With the aid of the solvent, a low viscosity suitable for reliable application may be imparted to the filling compound. This applies even to when the filling compound is highly filled with phosphor particles. The solvent may be n-heptane, for example. The solvent may evaporate of its own accord after applying the filling compound. Alternatively, a heat treatment step may be carried out to cause the solvent to evaporate in a targeted manner.

The use of a solvent in the filling compound containing phosphor may furthermore be employed with regard to the above-described process of defining a suitable reflector structure. In this example, the solvent or the evaporation thereof affords the possibility of influencing the shape of the surface of the conversion layer with regard to subsequently forming the reflective layer, as desired or depending on the application.

In this sense, in accordance with a further example, it is provided that after applying the filling compound, the conversion layer comprises a planar surface or a concavely curved surface between the semiconductor chips, and that the surface of the conversion layer present between the semiconductor chips is concavely or more highly concavely curved after the solvent has evaporated. This configuration makes use of wetting of the side faces of the semiconductor chips with the conversion layer, which may extend at the side faces as far as rear-side edges of the semiconductor chips.

The thickened conversion layer may alternatively be formed such that a surface of the conversion layer between the semiconductor chips is planar. In this example, the conversion layer may terminate flush with rear-side edges of the semiconductor chips. This may be realized by virtue of the fact that after applying the filling compound, the conversion layer comprises a convexly curved surface between the semiconductor chips, and the surface of the conversion layer is planar after the solvent has evaporated.

Applying the filling compound containing phosphor next to and between the semiconductor chips may be carried out, for example, by metering with the aid of a dispenser (dispensing). Applying in the form of droplets with the aid of a printing device (jetting), spraycoating, applying with the aid of a doctor blade or potting is furthermore possible. The filling compound may be applied in a manner extending as far as rear-side edges of the semiconductor chips. If the semiconductor chips are covered with the filling compound at the rear side after the applying, it is furthermore possible to carry out a cleaning step to remove the filling compound at these locations.

After thickening the conversion layer, the reflective layer may be formed such that the reflective layer comprises a planar surface between the contacts of the semiconductor chips and terminates flush with the contacts. To form the reflective layer, a reflective compound may be applied on the conversion layer and the semiconductor chips. The reflective compound and thus the reflective layer may comprise a basic or matrix material and scattering particles. The matrix material may be a plastics material such as, for example, a silicone material or an epoxy material. The scattering particles may be $TiO_2$ particles, for example. The reflective layer may be formed with a high degree of filling of scattering particles such that a high reflectivity may be achieved.

In this context, the use of a solvent in the reflective compound may likewise be considered. For this purpose, in accordance with a further example, forming the reflective layer comprises applying a reflective compound, wherein the reflective compound comprises a solvent that evaporates after applying the reflective compound. This configuration promotes formation of the reflective layer with a high packing density of scattering particles. With the aid of the solvent, a low viscosity suitable for reliable application may be imparted to the reflective compound, even if the latter is highly filled with scattering particles. The solvent may be n-heptane, for example. Applying the reflective compound may be carried out such that the reflective layer constituted thereby first comprises a convexly curved surface between the contacts of the semiconductor chips, whereas a planar surface may be present after the solvent has evaporated. The solvent may evaporate of its own accord. Alternatively, a heat treatment step may be carried out to cause the solvent to evaporate in a targeted manner. If the contacts of the semiconductor chips are covered with the reflective layer at the rear side after the application, it is furthermore possible to carry out a cleaning step to remove the reflective layer at these locations.

In a further example, arranging the semiconductor chips, applying the filling compound and applying the reflective compound are each carried out in a state in which the conversion layer is not fully cured. Curing the reflective layer and the conversion layer is carried out before severing. This may be carried out with the aid of a thermal or furnace process. The compounds and layers used in the method may be in a wet and tacky state before curing. By such wet processing, the compounds and layers may be connected to one another reliably and fixedly. Furthermore, a complex and costly use of cleaning and activating processes may be obviated.

It is possible, if appropriate, after providing or applying individual layers or compounds to carry out intermediate curing with the aid of a thermal step. This may be considered, for example, with regard to the conversion layer provided at the beginning of the method. In this example, after arranging the semiconductor chips, intermediate curing may be carried out to fix the semiconductor chips on the conversion layer.

In a further example, the radiation-emitting semiconductor components are formed such that a corresponding or at least similar layer thickness of the conversion layer is present in the region of the front side and in the region of the side faces of the semiconductor chip. A radiation emission with a high color locus homogeneity over different emission angles during operation of the semiconductor components is possible in this way, too.

The semiconductor components may be produced, for example, such that the conversion layer comprises a thickness of 30 µm to 120 µm. The choice of the layer thickness may be dependent on the sought color locus of the light radiation generated by the semiconductor components. With such small layer thicknesses, efficient heat dissipation for the conversion layer during operation of the semiconductor components may be further promoted.

In a departure from the examples mentioned above, the method may be carried out such that there is a different material constitution, for example, a different phosphor concentration and/or different types of phosphor particles, in the conversion layer provided at the beginning of the method and in the thickened regions of the conversion layer next to and between the semiconductor chips. Moreover, consideration may be given to using different matrix materials for the conversion layer provided at the beginning and the filling compound used to thicken the conversion layer. Furthermore, it is possible to realize radiation-emitting semiconductor components comprising a different layer thickness of the conversion layer in the region of the front side and in the region of the side faces of the semiconductor chips, as will be described below.

In a further example, the radiation-emitting semiconductor components are formed such that a layer thickness of the conversion layer in the region of the side faces of the semiconductor chip is greater than a layer thickness of the conversion layer in the region of the front side of the semiconductor chip. Such a configuration may be considered, for example, to provide larger distances between the semiconductor chips when arranging the semiconductor chips on the initial conversion layer and thereby compensate for possible tolerances when arranging the semiconductor chips.

In this context, it is furthermore possible for the filling compound applied for the purpose of thickening the conversion layer next to and between the semiconductor chips additionally to comprise a particulate transparent and hence optically passive filler. In this way, it is possible to produce radiation-emitting semiconductor components in which the conversion layer comprises a larger layer thickness in the region of the side faces of the semiconductor chip than in the region of the front side, and in which the phosphor content in the conversion layer in the region of the side faces corresponds to the phosphor content in the region of the front side of the semiconductor chip such that a corresponding radiation conversion may occur at these locations. On account of the filler, the conversion layer may comprise a high particle content even in the region of the side faces of the semiconductor chip that enables efficient heat dissipation for the conversion layer. In this configuration, the particle content comprises phosphor particles and transparent filler particles. Applying the filling compound admixed with the filler may correspondingly be promoted by the filling compound, as specified above, comprising a solvent that evaporates or can be evaporated after the applying.

The filler may be realized in the form of particles or beads comprising a transparent material. Particles comprising a quartz material are possible, for example, whereby efficient heat dissipation for the conversion layer may be promoted. Alternatively, other particles, for example, particles comprising a glass material may be employed.

To prevent increased scattering from occurring on account of the filler particles, the filler particles may be formed from a transparent material whose refractive index is close to the refractive index of the matrix material. In this example, the difference in refractive index between the transparent material of the filler particles and the matrix material may be not higher than 0.1, for example, not higher than 0.05.

To produce radiation-emitting semiconductor components whose conversion layer comprises a larger layer thickness in the region of the side faces of the semiconductor chip than in the region of the front side, consideration may alternatively be given to providing, in the filling compound used to thicken the conversion layer next to and between the semiconductor chips, a less active phosphor than in the conversion layer provided at the beginning of the method such that the semiconductor components comprise, in the region of the side faces of the semiconductor chip, a less active phosphor than in the region of the front side of the semiconductor chip. In this way, it is possible to produce radiation-emitting semiconductor components in which the conversion layer comprises a larger phosphor content in the region of the side faces of the semiconductor chip than in the region of the front side, wherein the use of the less active phosphor in the region of the side faces has the effect that a corresponding radiation conversion may occur in the region of the front side and in the region of the side faces of the semiconductor chip. In this configuration, the conversion layer may comprise a high particle content comprising exclusively phosphor particles even in the region of the side faces of the semiconductor chip, which makes possible efficient heat dissipation for the conversion layer.

With regard to achieving efficient heat dissipation, in accordance with a further example, the conversion layer is formed such that the conversion layer comprises a particle content related to the volume of the conversion layer of at least 40%. As was specified above, the particle content may comprise phosphor particles and, if appropriate, filler particles. The heat dissipation may be further promoted by the particle content being at least 50%, for example, 55%.

In accordance with a further example, presence of efficient heat dissipation is utilized to provide a matrix material comprising a refractive index of at least 1.5 for the conversion layer provided at the beginning of the method and for the filling compound used to thicken the conversion layer. Use of such a high refractive index matrix material makes it possible to achieve efficient coupling-out of radiation from the conversion layer during operation of the semiconductor components. By way of example, a phenylized silicone material may be employed as high refractive index matrix material. High refractive index matrix materials may be temperature-sensitive, but this is harmless on account of the efficient heat dissipation for the conversion layer.

In a further example, the conversion layer is provided on an auxiliary carrier. For this purpose, a compound containing phosphor may be applied on the auxiliary carrier. The auxiliary carrier may be a carrier substrate or a carrier film. Applying the compound containing phosphor may be carried out by spraycoating, for example. To carry out this process, the compound may comprise a solvent such as n-heptane, for example, which may evaporate or may be evaporated after the spraycoating. Other processes such as, for example, applying a compound containing phosphor with the aid of a screen printing or stencil printing process are also possible.

In a further example, the conversion layer provided at the beginning is precharacterized before arranging the semiconductor chips. In this example, the conversion layer may be irradiated with a measurement radiation and a radiation measurement may be carried out. By way of example, an absorption of the measurement radiation in the conversion layer may be determined. Moreover, a conversion radiation emitted by the conversion layer may be measured. The precharacterization of the conversion layer makes possible a higher yield. By way of example, an unsuitable conversion layer may be sorted out, or subsequent steps may be carried out on the basis of the precharacterization.

The separate semiconductor components may be characterized after the singulation. Sorting the semiconductor components may be carried out on the basis of this.

We also provide a radiation-emitting semiconductor component. The semiconductor component comprises a single radiation-emitting semiconductor chip. The semiconductor chip comprises contacts at a rear side. A further component part of the semiconductor component is a conversion layer containing phosphor for radiation conversion arranged on a front side and on side faces of the semiconductor chip. Furthermore, the semiconductor component comprises a reflective layer arranged in the region of the rear side on the semiconductor chip and on the conversion layer. A rear-side surface of the contacts of the semiconductor chip is not covered with the reflective layer and is freely accessible as a result.

The radiation-emitting semiconductor component may be produced in accordance with the method described above or in accordance with one or more of the examples of the method described above. Therefore, features, examples and details described above may be considered correspondingly for the semiconductor component.

During operation of the radiation-emitting semiconductor component, the semiconductor chip may generate a primary, for example, blue light radiation that may be at least partly converted with the aid of the conversion layer. As a result, by way of example, a white light radiation may be generated and emitted via the conversion layer. A rear-side radiation emission may be suppressed by the reflective layer present at the rear side. The conversion layer, which may directly adjoin the semiconductor chip and cover the front side and side faces thereof, may comprise a small layer thickness and a high phosphor and hence particle content. Efficient heat dissipation for the conversion layer is possible as a result.

In a further example, a corresponding layer thickness of the conversion layer is present in the region of the front side and in the region of the side faces of the semiconductor chip. As a result, during operation, the semiconductor component may emit a light radiation with a high color locus homogeneity over different emission angles.

In a further example, the reflective layer comprises an outwardly increasing layer thickness in a region in which the reflective layer adjoins the conversion layer. In this configuration, the interface between the conversion layer and the reflective layer may extend obliquely or substantially obliquely with respect to a front side and rear side of the semiconductor component. Not only may the reflective layer prevent a rear-side radiation emission during operation of the semiconductor component, but in addition, a lateral radiation emission may be reduced and the luminous efficiency may be improved as a result.

The conversion layer may comprise a matrix material such as, for example, a silicone material or epoxy material and phosphor particles embedded therein and bring about the radiation conversion. If the radiation-emitting semiconductor component is realized such that a layer thickness of the conversion layer in the region of the side faces of the semiconductor chip is greater than a layer thickness of the conversion layer in the region of the front side of the semiconductor chip, the conversion layer may additionally comprise a transparent particulate filler in the region of the side faces.

In a further example, the conversion layer comprises a particle content related to the volume of the conversion layer of at least 40%. In this way, it is possible to achieve efficient heat dissipation for the conversion layer during operation of the semiconductor component. The heat dissipation may be further promoted by the particle content being at least 50%, for example, 55%. The particle content may comprise exclusively phosphor particles, or phosphor particles and filler particles.

In a further example, the conversion layer comprises a matrix material comprising a refractive index of at least 1.5. As a result, a light radiation may be coupled out from the conversion layer with a high efficiency during operation of the semiconductor component. In this configuration, the matrix material may be a phenylized silicone material, for example.

The advantageous configurations and developments explained above can be applied individually or alternatively in arbitrary combination with one another—apart from, for example, in unambiguous dependencies or incompatible alternatives.

The above-described properties, features and advantages and the way in which they are achieved will become clearer and more clearly understood in association with the following description of examples explained in greater detail in association with the drawings.

Possible configurations of radiation-emitting semiconductor components 100 and associated cost-effective production methods are described with reference to the following schematic figures. The semiconductor components 100 are CSP LEDs (Chip Size Package Light Emitting Diode) comprising a single radiation-emitting semiconductor chip 140, which diodes may be used for general lighting. In the context of production, processes known from fabrication of optoelectronic components may be carried out and materials customary in these fields may be used, and thus will be discussed only in part. In the same way, further processes may be carried out in addition to processes shown and described, and the semiconductor components 100 may be fabricated with further component parts and structures in addition to component parts shown and described. Furthermore, the figures are merely of schematic nature and are not true to scale. In this sense, component parts and structures shown in the figures may be illustrated with exaggerated size or size reduction to afford a better understanding.

FIGS. 1 to 6 show one possible method of producing radiation-emitting semiconductor components 100 on the basis of lateral sectional illustrations. The method involves fabricating a continuous component assemblage subsequently singulated into separate semiconductor components 100.

Figure 1:
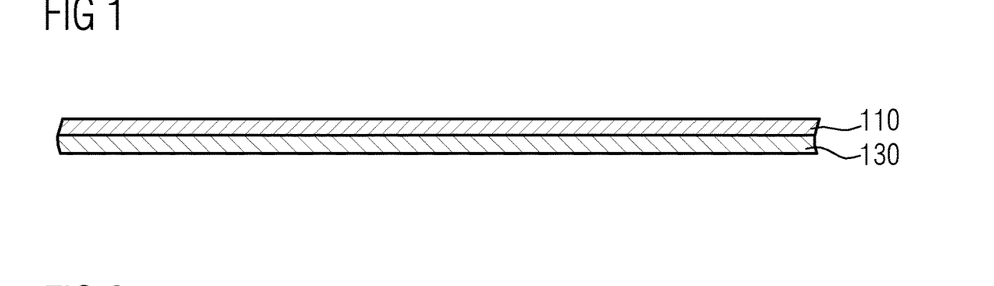
FIGS. 1 to 6 schematically show one possible method of producing radiation-emitting semiconductor components on the basis of lateral illustrations, wherein a conversion layer is provided on an auxiliary carrier, radiation-emitting semiconductor chips are arranged on the conversion layer, the conversion layer is thickened in regions next to and between the semiconductor chips by applying a conversion compound, a reflective layer is formed in the region of the rear side of the semiconductor chips, and singulating is carried out.

At the beginning of the method, a plane conversion layer 110 containing phosphor is provided on an auxiliary carrier 130, as shown as an excerpt in FIG. 1. The auxiliary carrier 130 may be, for example, a carrier substrate comprising Teflon or Kapton. A configuration of the auxiliary carrier 130 in the form of a thermal release film, that is to say an adhesive film whose adhesive effect may be canceled by action of heat, is also possible.

To provide the conversion layer 110, a conversion compound containing phosphor is applied on the auxiliary carrier 130. It is possible, for example, to spray the conversion compound on the auxiliary carrier 130, which is also referred to as spraycoating. Alternatively, applying the conversion compound on the auxiliary carrier 130 may be carried out with the aid of some other process, for example, with the aid of a screen printing or stencil printing process (respectively not illustrated).

Figure 17:
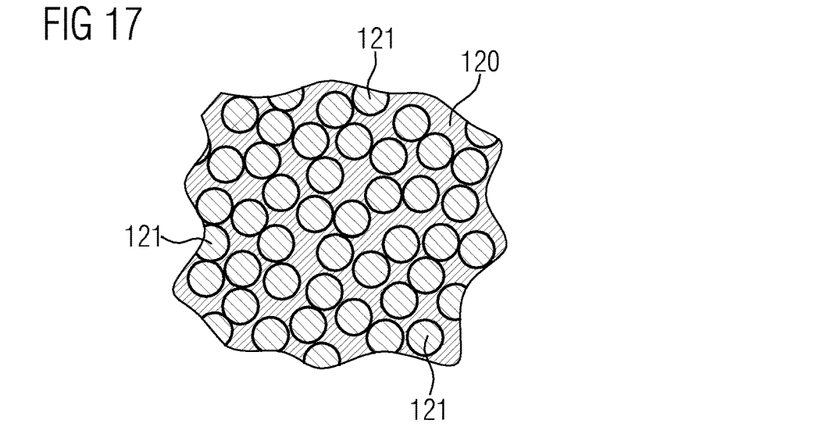
FIG. 17 schematically shows an enlarged illustration of a conversion layer comprising a matrix material and phosphor particles.

The conversion compound and thus the conversion layer 110 comprise a radiation-transmissive matrix material 120 and phosphor particles 121 embedded therein for radiation conversion (cf. FIG. 17). The matrix material 120 may be an organic material or a plastics material such as, for example, a silicone material or epoxy material. Alternatively, the use of some other similarly optically stable plastics material is possible. The phosphor particles 121 convert a primary light radiation generated by a semiconductor chip 140 at least partly into one or more secondary light radiations of longer wavelength. It is possible that the conversion compound comprises one type of phosphor particles 121 and, in this respect, one conversion radiation may be generated. A configuration is also possible in which the conversion compound comprises different types of phosphor particles and, consequently, a plurality of different conversion radiations may be emitted.

The suspension or conversion compound applied for the purpose of forming the conversion layer 110 on the auxiliary carrier 130 may furthermore be diluted with a solvent that evaporates after applying the conversion compound. Such a constitution may be considered, for example, with regard to spraycoating the conversion compound. The solvent may be n-heptane, for example. On account of the solvent, the conversion compound may comprise a low viscosity suitable for reliable application. The solvent may evaporate of its own accord after applying the conversion compound. It is also possible to carry out a thermal step to cause the solvent to evaporate in a targeted manner (not illustrated).

Before further steps are carried out, the conversion layer 110 provided on the auxiliary carrier 130 may be precharacterized. For this purpose, the conversion layer 110 may be irradiated with a measurement radiation and a radiation measurement may be carried out (not illustrated). It is possible, for example, to detect absorption of the measurement radiation in the conversion layer 110 and measure conversion radiation emitted by the conversion layer 110.

A higher yield may be achieved in this way. By way of example, it may be ascertained that the conversion layer 110 is unsuitable for further processing. Thus, the conversion layer 110 may be sorted out and a further conversion layer 110 may be provided or used. Furthermore, subsequent method steps may be carried out on the basis of the precharacterization of the conversion layer 110. In this example, subsequent component parts and layers may be selected or formed in a manner coordinated with the precharacterization.

Figure 2:
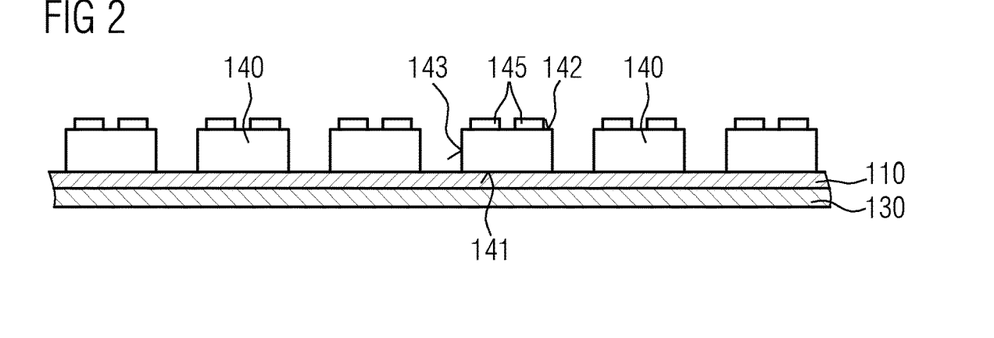

After providing and, if appropriate, precharacterizing the conversion layer 110 containing phosphor on the auxiliary carrier 130, radiation-emitting semiconductor chips 140 are arranged on the conversion layer 110, as illustrated in FIG. 2. In this process, the semiconductor chips 140 may be positioned in the form of rows and columns on the conversion layer 110 (not illustrated). Arranging the semiconductor chips 140 is carried out in a wet and tacky state of the conversion layer 110 in which the conversion layer 110 is not fully cured.

The semiconductor chips 140 comprise a front side 141, a rear side 142 opposite to the front side 141, and lateral side faces 143 extending between the front side 141 and the rear side 142. At the rear side 142, the semiconductor chips 140 comprise contacts 145, via which electrical energy may be fed to the semiconductor chips 140. The semiconductor chips 140 are arranged by the front sides 141 thereof on the conversion layer 110.

The radiation-emitting semiconductor chips 140 are LED chips (Light Emitting Diode) realized in the form of volume emitting flip-chips. In this configuration, a primary light radiation generated during operation of the semiconductor chips 140 may be emitted via the front side 141 and side faces 143 thereof. The semiconductor chips 140 may comprise a radiation-transmissive chip substrate comprising sapphire that constitutes the front side 141 and a significant part of the side faces 143. At the rear side, the semiconductor chips 140 may comprise a semiconductor layer sequence arranged on the chip substrate and comprising an active zone that generates radiation (respectively not illustrated). The contacts 145 may be located thereon. As viewed from above, the semiconductor chips 140 may comprise a rectangular or square plan view shape (cf. FIG. 8). The semiconductor chips 140 or the active zone thereof may be configured to generate a primary blue light radiation.

Figure 3:
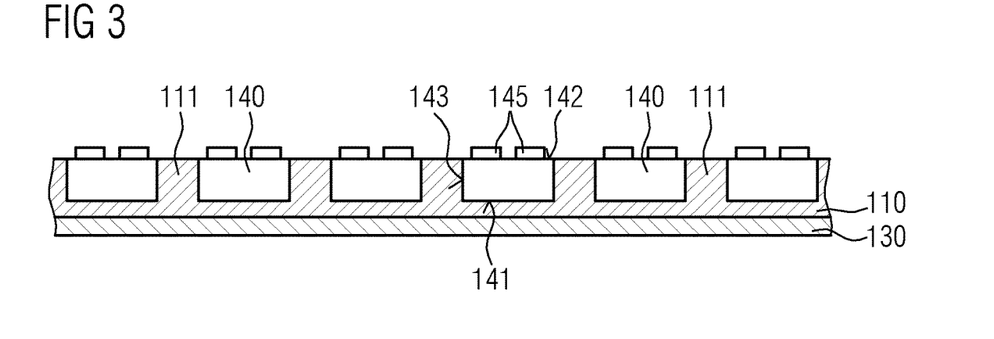

This is followed by applying a filling compound 111 containing phosphor next to and between the semiconductor chips 140 such that the conversion layer 110 is thickened in these regions as shown in FIG. 3. The conversion layer 110 present after thickening directly adjoins the front sides 141 and the side faces 143 of the semiconductor chips 140.

The filling compound 111 used is likewise a conversion compound comprising a radiation-transmissive matrix material 120, for example, a silicone material or epoxy material, and phosphor particles 121 embedded therein for radiation conversion (cf. FIG. 17). The filling compound 111 and the conversion compound (cf. FIG. 1) applied at the beginning of the method of forming the conversion layer 110 on the auxiliary carrier 130 may correspond in terms of the material constitution and comprise the same matrix material 120 and the same phosphor particles 121. The filling compound 111 may therefore comprise one type of phosphor particles 121 or different types of phosphor particles 121.

Applying the filling compound 111 next to and between the semiconductor chips 140 may be carried out, for example, by dispensing, that is to say by metering with the aid of a dispenser. Alternatively, other processes may be considered, for example, applying in the form of droplets with the aid of a printing device, also referred to as jetting, spraycoating, applying with the aid of a doctor blade or potting (respectively not illustrated). Applying the filling compound 111 is also carried out in a wet and tacky state of the previously provided conversion layer 110 in which the conversion layer 110 is not fully cured.

As shown in FIG. 3, the filling compound 111 is applied in a manner extending as far as rear-side edges of the semiconductor chips 140. Furthermore, applying the filling compound 111 is carried out such that after applying the filling compound 111, the thickened conversion layer 110 comprises a planar surface between the semiconductor chips 140 and terminates flush with the semiconductor chips 140. When the semiconductor chips 140 are covered with the filling compound 111 at the rear side in an undesired manner after the applying, not illustrated, it is furthermore possible to carry out a cleaning step of removing the filling compound 111 at these locations.

In addition to the matrix material 120 and the phosphor particles 121, the filling compound 111 used comprises a solvent (not illustrated) that evaporates after applying the filling compound 111. In this example, the solvent, which is n-heptane, for example, may evaporate of its own accord or may be evaporated in a targeted manner with the aid of a thermal step. On account of the solvent, the filling compound 111 may comprise a low viscosity suitable for reliable application.

Figure 4:
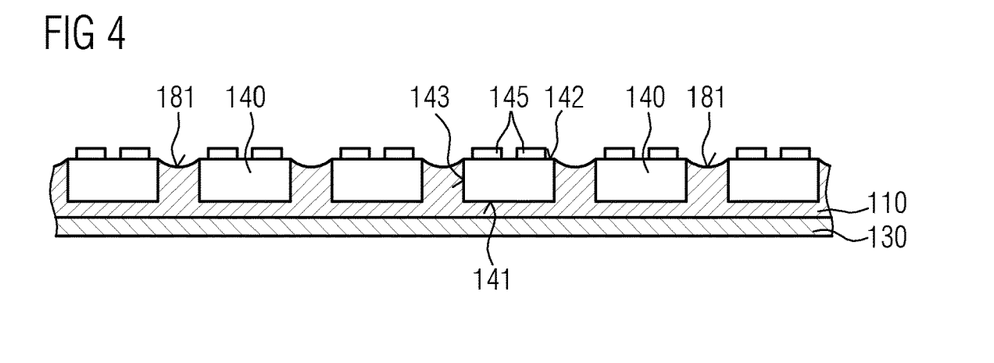

Use of the filling compound 111 diluted with the solvent and evaporation of the solvent furthermore make it possible to define a suitable reflector structure for the semiconductor components 100 to be produced. This exploits the fact that the conversion layer 110 extending furthermore to the rear-side edges of the semiconductor chips 140 on account of a wetting of the side faces 143 of the semiconductor chips 140, after evaporation of the solvent and a decrease in volume associated therewith, as illustrated in FIG. 4, has a concavely curved surface 181 between the semiconductor chips 140.

Figure 5:
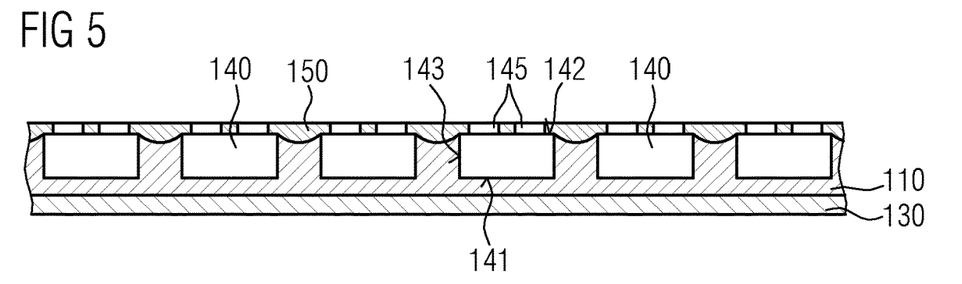

After evaporation of the solvent contained in the filling compound 111, as illustrated in FIG. 5, a reflective layer 150 is formed on the conversion layer 110 and on the semiconductor chips 140 in the region of the rear side 142 of the semiconductor chips 140. The reflective layer 150 extends as far as upper edges of the contacts 145 of the semiconductor chips 140 and terminates flush with the contacts 145 such that a rear-side surface of the contacts 145 is not covered with the reflective layer 150. As a result, the contacts 145 are still accessible for contacting. The reflective layer 150 comprises a planar surface between the contacts 145.

To form the reflective layer 150, a reflective compound is applied on the conversion layer 110 and the semiconductor chips 140. This may be carried out by potting or dispensing, for example. The reflective layer 150 comprises a matrix material, for example, a silicone material or an epoxy material, and scattering particles embedded therein, for example, $TiO_2$ particles (respectively not illustrated). Applying the reflective compound is carried out in a wet and tacky state of the previously thickened conversion layer 110 in which the conversion layer 110 is not fully cured.

It is possible for the reflective compound used to form the reflective layer 150 additionally to comprise a solvent such as n-heptane, for example, that evaporates after applying the reflective compound. In this example, the solvent may evaporate of its own accord or may be evaporated in a targeted manner with the aid of a thermal step. Furthermore, the reflective compound may be applied with a defined over-potting such that the reflective layer 150 may first comprise a convexly curved surface between the contacts 145 (respectively not illustrated). As a result of evaporation of the solvent, the surface of the reflective layer 150 may assume the planar shape shown in FIG. 5. When the contacts 145 of the semiconductor chips 140 are covered with the reflective layer 150 at the rear side in an undesired manner after the applying, not illustrated, it is furthermore possible to carry out a cleaning step of removing the reflective layer 150 at these locations.

After forming the reflective layer 150, a process of fully curing the previously applied compounds and layers, i.e. in this example the conversion layer 110 and the reflective layer 150, is carried out. A thermal or furnace process may be carried out for this purpose.

Figure 6:
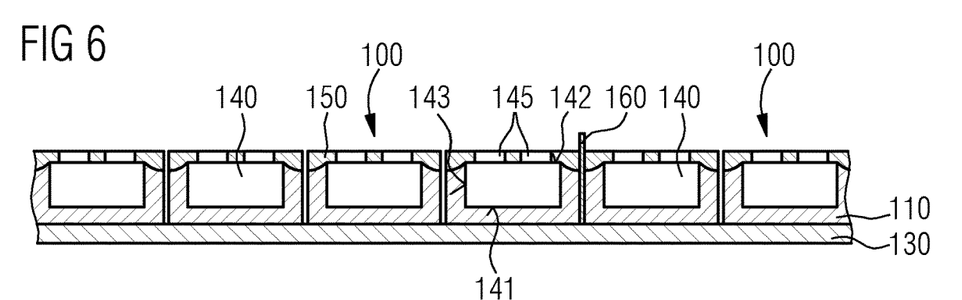

Afterward, the component assemblage formed in this way is singulated into separate radiation-emitting semiconductor components 100 by severing the reflective layer 150 and the conversion layer 110 as shown in FIG. 6, in regions between the semiconductor chips 140. A sawing process may be carried out for this purpose as indicated on the basis of a saw blade 160 in FIG. 6. After singulation, the separate semiconductor components 100 may be removed from the auxiliary carrier 130. Furthermore, the semiconductor components 100 may be characterized and sorted on the basis thereof (not illustrated).

Figure 7:
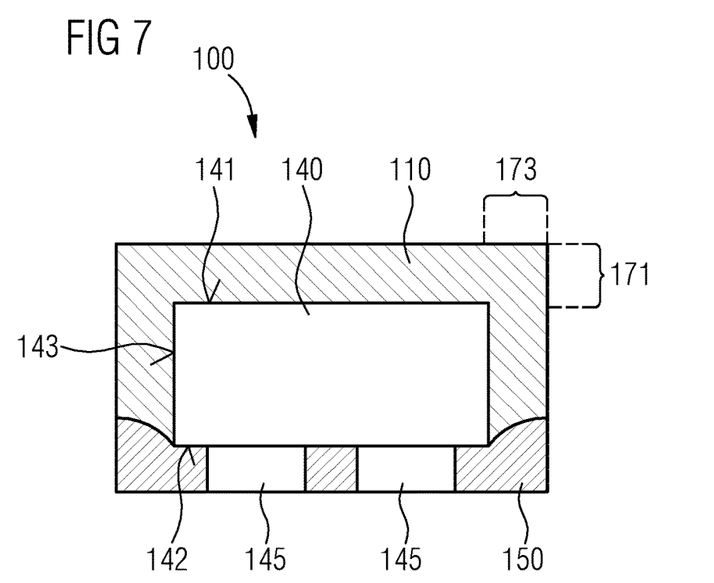
FIG. 7 schematically shows a lateral illustration of a radiation-emitting semiconductor component in which a corresponding conversion layer thickness is present in the region of the front side and in the region of the side faces of the semiconductor chip.
Figure 8:
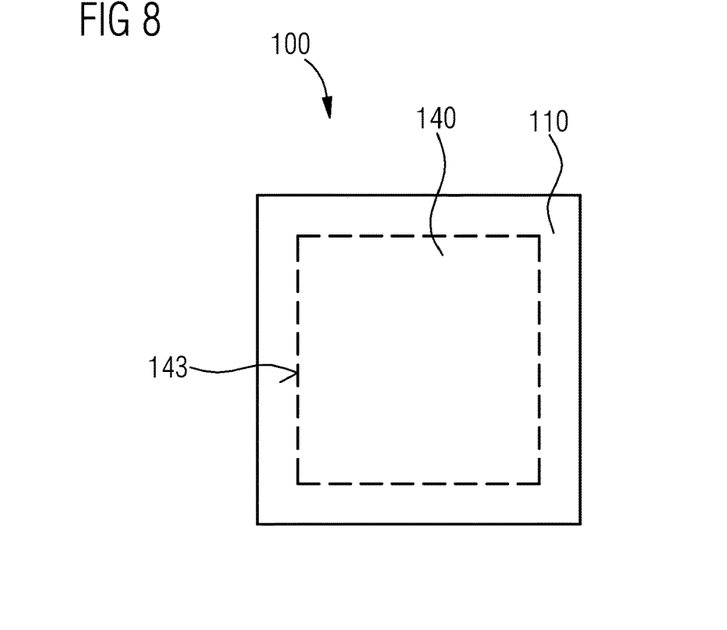
FIG. 8 schematically shows a plan view illustration of a radiation-emitting semiconductor component.

FIGS. 7 and 8 show an enlarged lateral sectional illustration and a plan view illustration of a radiation-emitting semiconductor component 100 produced in accordance with the method described above. The following description of features and details may be applied with regard to all of the semiconductor components 100 produced by the method.

The radiation-emitting semiconductor component 100 comprises a single radiation-emitting semiconductor chip 140 comprising two rear-side contacts 145, a severed part of the conversion layer 110 covering the front side 141 and the side faces 143 of the semiconductor chip 140, and a severed part of the reflective layer 150 arranged in the region of the rear side on the semiconductor chip 140 and on the conversion layer 110 (cf. FIG. 7). The rear-side surface of the contacts 145 is uncovered. As viewed from above, the semiconductor component 100, like the semiconductor chip 140 thereof, may comprise a rectangular or square shape (cf. FIG. 8).

During radiation operation of the radiation-emitting semiconductor component 100 in which the semiconductor chip 140 may be supplied with electrical energy via the contacts 145, the semiconductor chip 140 may generate a primary blue light radiation. The primary light radiation may be emitted via the front side 141 and the side faces 143 and be coupled into the conversion layer 110. The primary light radiation may be at least partly converted with the aid of the conversion layer 110. Depending on the configuration of the conversion layer 110 comprising one type of phosphor particles 121 or different types of phosphor particles 121, the primary light radiation may in this example be converted into one or more conversion radiations of longer wavelength. In this way, a white light radiation may be generated and emitted via the conversion layer 110 of the semiconductor component 100 (not illustrated).

The reflective layer 150 present at the rear side of the radiation-emitting semiconductor component 100 serves as reflector to suppress a rear-side radiation emission during operation of the semiconductor component 100. On account of the concave meniscus 181 of the conversion layer 110 each fabricated between the semiconductor chips 140 in the method (cf. FIG. 4), the reflective layer 150 of the semiconductor component 100 comprises, in a region in which the reflective layer 150 adjoins the conversion layer 110, in cross section a layer thickness increasing outwardly in a lateral direction (cf. FIG. 7). In this example, the interface between the conversion layer 110 and the reflective layer 150 may extend substantially obliquely with respect to a front side and rear side of the semiconductor component 100. As a result of this structure, with the aid of the reflective layer 150, in addition a lateral radiation emission may be reduced and the luminous efficiency may be increased as a result.

The use of an adhesive layer between the conversion layer 110 and the semiconductor chip 140 is obviated in the radiation-emitting semiconductor component 100. Instead, the conversion layer 110 is arranged directly on the semiconductor chip 140 or on the front side 141 and side faces 143 thereof (cf. FIG. 7). In this way, the semiconductor component 100 may comprise a long lifetime. Moreover, the primary radiation generated by the semiconductor chip 140 may be coupled into the conversion layer 110 with a high efficiency.

As indicated in FIG. 7, the radiation-emitting semiconductor component 100 may be produced such that a layer thickness 171 of the conversion layer 110 present in the region of the front side 141 of the semiconductor chip 140 corresponds to a layer thickness 173 of the conversion layer 110 present in the region of the side faces 143. This configuration makes it possible that the semiconductor component 100 may emit a light radiation with a high color locus homogeneity over different emission angles during operation.

The conversion layer 110 of the radiation-emitting semiconductor component 100, including the part of the conversion layer 110 covering the side faces 143 of the semiconductor chip 140, may be formed with a high packing density of phosphor particles 121 and thus with a high particle content. This is made possible by the above-described procedure of arranging semiconductor chips 140 on the initially planar conversion layer 110 and then thickening the conversion layer 110 next to and between the semiconductor chips 140 with the filling compound 111.

Producing the conversion layer 110 with a high particle content may furthermore be promoted by diluting with a solvent the conversion compound used at the beginning of the method of providing the conversion layer 110 and the filling compound 111 used to thicken the conversion layer 110. As a result, the respective compounds may be highly concentrated and comprise a high phosphor content. On account of the solvent, a low viscosity suitable for the application may be imparted to the compounds.

As a result of the high degree of filling of phosphor particles 121, the conversion layer 110 of the radiation-emitting semiconductor component 100 may furthermore be produced with a small layer thickness. This is because as a result of the high phosphor content, a sufficient radiation conversion may be achieved even with a small layer thickness.

During operation of the radiation-emitting semiconductor component 100, heating of the conversion layer 110 may occur on account of conversion losses and waste heat of the semiconductor chip 140. The above-described configuration of the conversion layer 110 with a high phosphor content and hence particle content and a small layer thickness enables efficient heat dissipation for the conversion layer 110 in this context, with the result that heat-dictated effects such as a reduction of the efficiency of the radiation conversion and a color locus variation of the generatable light radiation may be reliably avoided. The thermal energy of the conversion layer 110 may be dissipated via the semiconductor chip 140 and the surrounding air.

On account of the efficient heat dissipation for the conversion layer 110, the radiation-emitting semiconductor component 100 may be distinguished by a high robustness, and a long lifetime may be further promoted. Furthermore, there is the possibility of operating the semiconductor component 100 with a high power density.

Efficient heat dissipation for the conversion layer 110 may be achieved, for example, if the conversion layer 110 comprises a layer thickness of 30 µm to 120 µm and a particle content related to the volume of the conversion layer 110 of at least 40% is present. By way of example, a particle content of at least 50%, for example, 55% may be expedient, whereby efficient heat dissipation may be provided to an even higher extent.

The property of efficient heat dissipation for the conversion layer 110 present in the semiconductor component 100 may furthermore be utilized to provide for the conversion layer 110 a matrix material 120 comprising a high refractive index, for example, comprising a refractive index of at least 1.5. For such a configuration, the conversion layer 110 provided at the beginning of the method and the filling compound 111 used to thicken the conversion layer 110 comprise such a high refractive index matrix material 120. This may be a phenylized silicone material, for example. The use of a high refractive index matrix material 120 enables an efficient coupling-out of radiation from the conversion layer 110 during operation of the semiconductor component 100. High refractive index matrix materials may be temperature-sensitive. This property may be harmless in this example on account of the efficient heat dissipation for the conversion layer 110.

The above-described use of a solvent in the reflective compound used to form the reflective layer 150 correspondingly affords the possibility of producing the reflective layer 150 of the radiation-emitting semiconductor component 100 with a high packing density of scattering particles. In this way, the reflective layer 150 may be distinguished by a high reflectivity.

Furthermore, the wet processing described above may be advantageous, in accordance with which arranging the semiconductor chips 140, applying the filling compound 111 and applying the reflective compound are each carried out in a state in which the conversion layer 110 is not fully cured, and the individual compounds and layers are jointly cured only at the end of the method before the singulation. In this way, the different compounds and layers may connect to one another reliably and fixedly.

A description is given below of possible variants and modifications which may be considered for the production method and radiation-emitting semiconductor components 100 fabricated thereby. Corresponding features, method steps and aspects and also identical and identically active component parts will not be described in detail again below. Instead, for details in respect thereof reference is made to the description above. Furthermore, aspects and details mentioned with regard to one configuration may also be applied with regard to another configuration and features of two or more configurations may be combined with one another.

Figure 9:
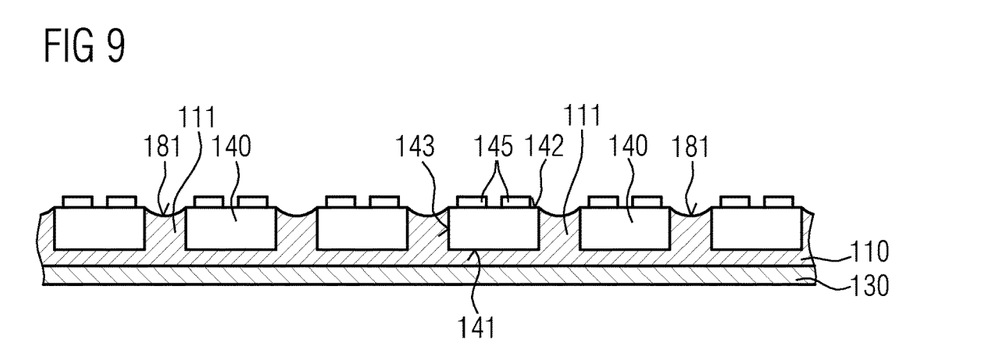
FIGS. 9 to 12 schematically show a further method of producing radiation-emitting semiconductor components on the basis of lateral illustrations, wherein applying the conversion compound is carried out such that the conversion compound comprises a concavely curved surface between the semiconductor chips.

FIGS. 9 to 12 show a further method of producing radiation-emitting semiconductor components 100 on the basis of lateral sectional illustrations. In this method, in a corresponding manner, a plane conversion layer 110 is provided on an auxiliary carrier 130, and radiation-emitting semiconductor chips 140 are arranged thereon as explained above with reference to FIGS. 1, 2. Subsequently applying a filling compound 111 comprising a matrix material 120, phosphor particles 121 and a solvent in regions next to and between the semiconductor chips 140 is carried out with a defined under-potting such that the thickened conversion layer 110, as illustrated in FIG. 9, comprises a concavely curved surface 181 between the semiconductor chips 140. In this example, the side faces 143 of the semiconductor chips 140 are wetted with the conversion layer 110, and the conversion layer 110 extends as far as rear-side edges of the semiconductor chips 140.

Figure 10:
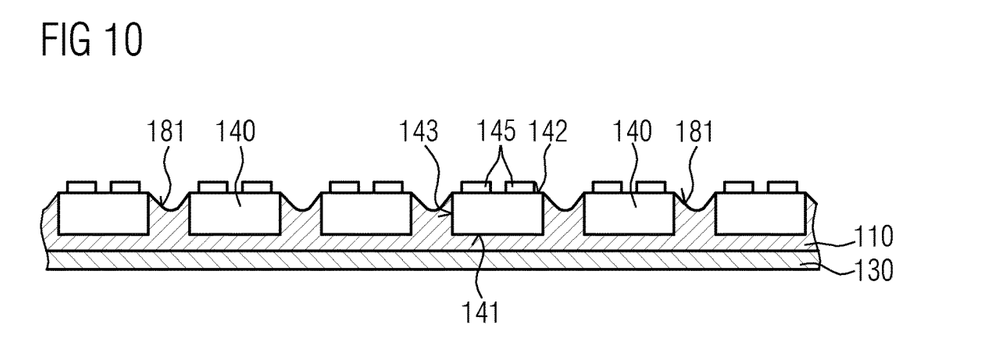
Figure 11:
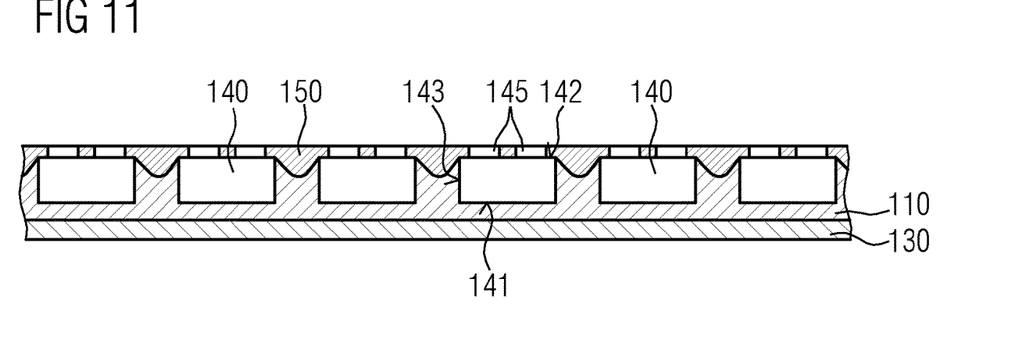
Figure 12:
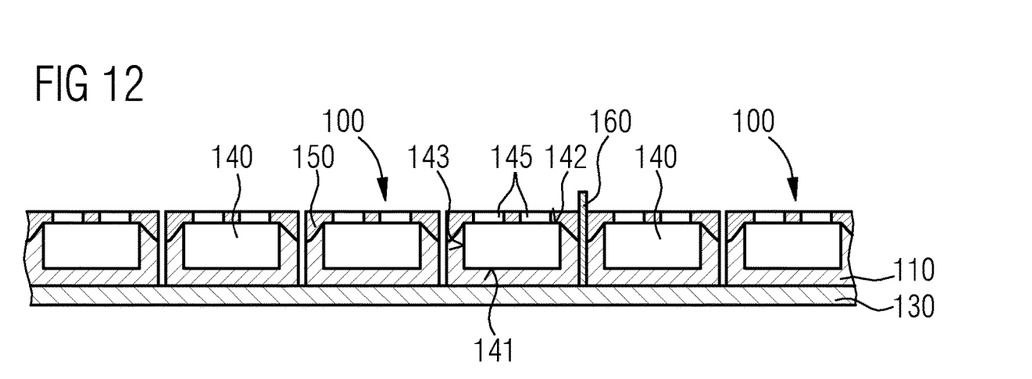

After evaporation of the solvent and a volume decrease associated therewith, the conversion layer 110, as illustrated in FIG. 10, comprises an even more highly concavely curved surface 181 between the semiconductor chips 140. This is followed by the further processes from among those described above, i.e. forming at the rear side a reflective layer 150 on the conversion layer 110 and on the semiconductor chips 140 (cf. FIG. 11), fully curing the previously applied compounds and layers, and singulating the component assemblage formed in this way into separate semiconductor components 100 (cf. FIG. 12). In these semiconductor components 100, the interface between the reflective layer 150 and the conversion layer 110 is formed in a more greatly curved manner or in a manner extending more greatly obliquely. In this way, a lateral radiation emission may be reduced to a higher extent.

Figure 13:
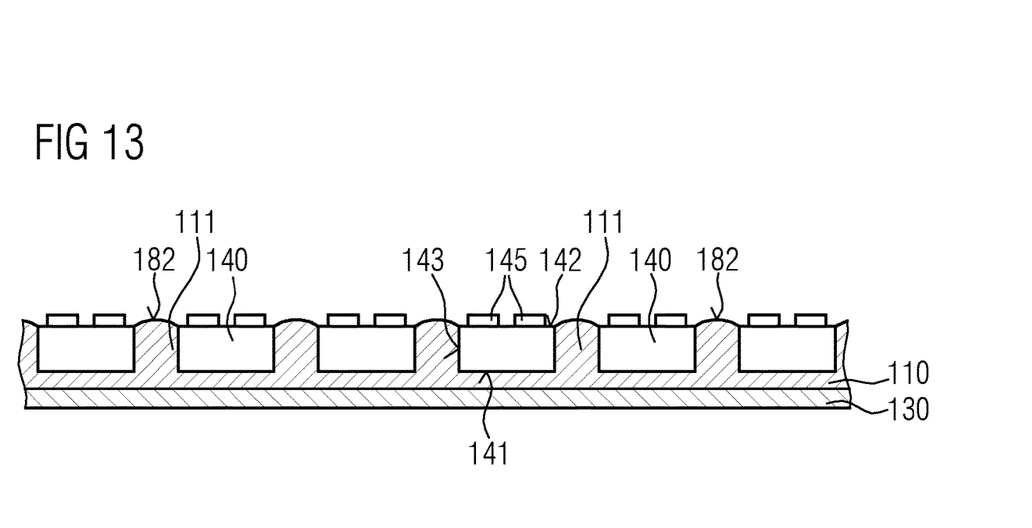
FIGS. 13 to 16 schematically show a further method of producing radiation-emitting semiconductor components on the basis of lateral illustrations, wherein applying the conversion compound is carried out such that the conversion compound comprises a convexly curved surface between the semiconductor chips.

FIGS. 13 to 16 show a further method of producing radiation-emitting semiconductor components 100 on the basis of lateral sectional illustrations. In this example, too, first a planar conversion layer 110 is provided on an auxiliary carrier 130, and radiation-emitting semiconductor chips 140 are arranged thereon as explained above with reference to FIGS. 1, 2. Subsequently applying a filling compound 111 comprising a matrix material 120, phosphor particles 121 and a solvent next to and between the semiconductor chips 140 is carried out with a defined over-potting such that the thickened conversion layer 110 extending as far as rear-side edges of the semiconductor chips 140 as illustrated in FIG. 13, comprises a convexly curved surface 182 between the semiconductor chips 140.

Figure 14:
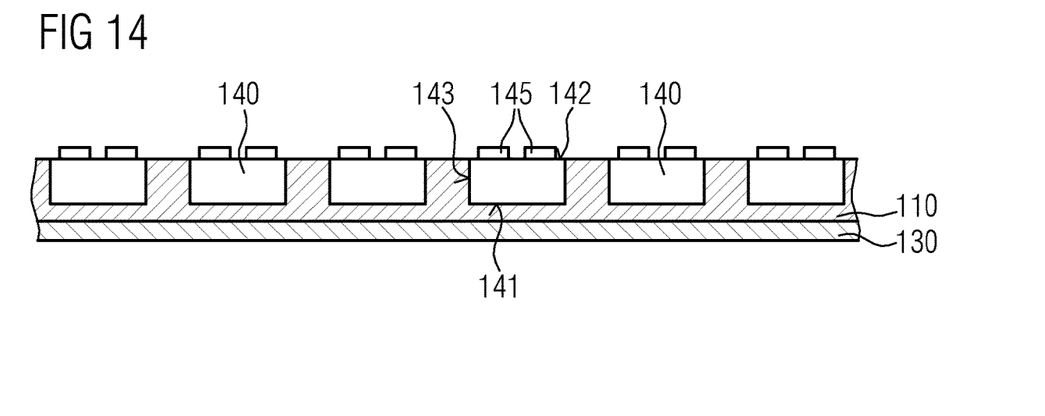
Figure 15:
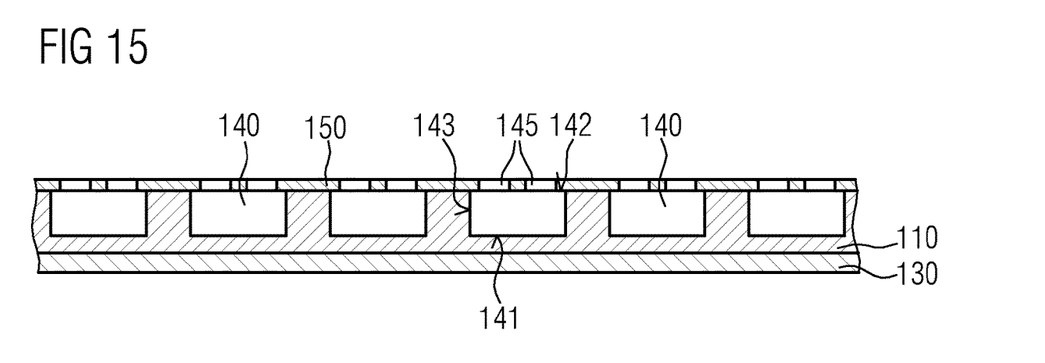
Figure 16:
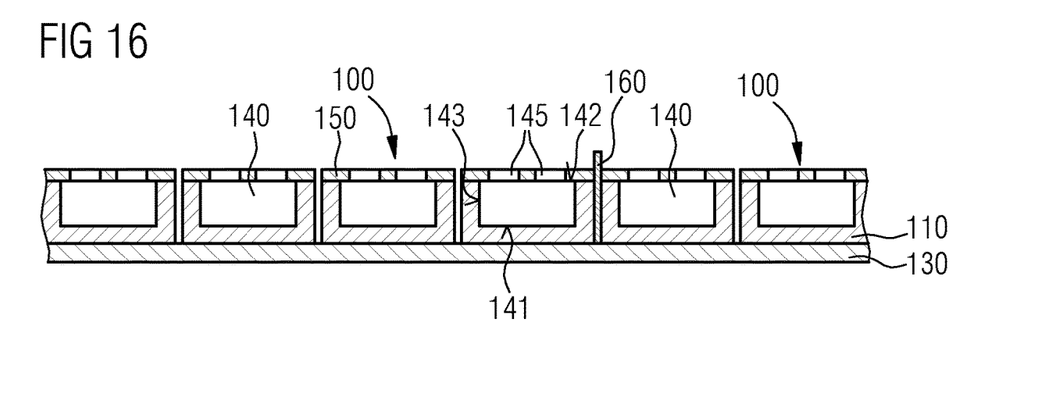

After evaporation of the solvent and a volume decrease associated therewith, the conversion layer 110 as illustrated in FIG. 14, comprises a planar surface between the semiconductor chips 140 and terminates flush with the semiconductor chips 140. This is followed by the further processes from among those described above, i.e. forming at the rear side a reflective layer 150 on the conversion layer 110 and on the semiconductor chips 140 (cf. FIG. 15), fully curing the previously applied compounds and layers, and singulating the component assemblage formed in this way into separate semiconductor components 100 (cf. FIG. 16). In these semiconductor components 100, the interface between the reflective layer 150 and the conversion layer 110 extends parallel to a front side and rear side of the components 100. In this way, with the aid of the reflective layer 150, it is possible substantially to prevent a rear-side radiation emission during operation of the semiconductor components 100.

FIG. 17 shows an enlarged illustration of an excerpt from a conversion layer 110 such as may be present in the semiconductor components 100 described above. The conversion layer 110 comprises a matrix material 120 and phosphor particles 121 embedded therein for radiation conversion. A high packing density of the phosphor particles 121 is present such that efficient heat conduction and hence efficient heat dissipation for the conversion layer 110 are possible.

In a departure from FIG. 17, configurations are possible in which the conversion layer 110 additionally comprises an optically passive filler. This will be discussed in greater detail below.

Figure 18:
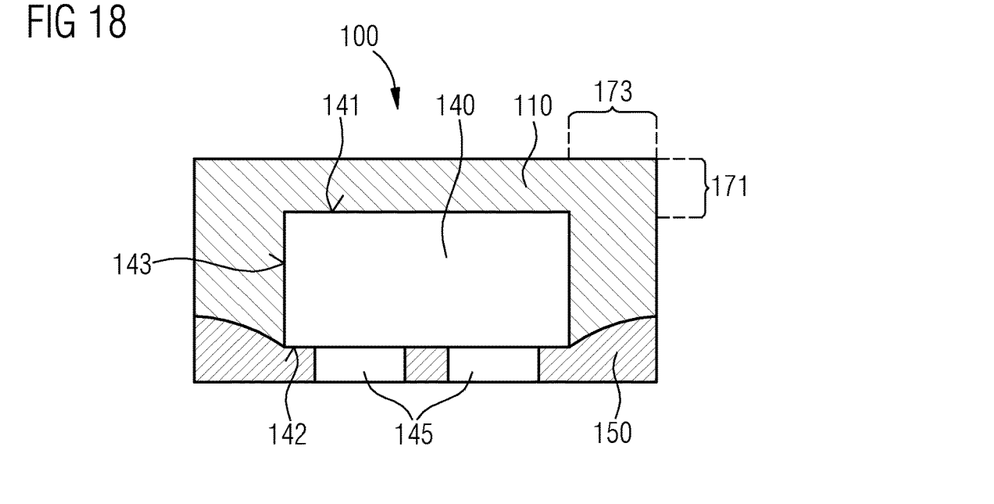
FIG. 18 schematically shows a lateral illustration of a radiation-emitting semiconductor component in which a different conversion layer thickness is present in the region of the front side and in the region of the side faces of the semiconductor chip.

FIG. 18 shows a lateral sectional illustration of a further radiation-emitting semiconductor component 100. In a departure from the design shown in FIG. 7, the semiconductor component 100 is produced such that a layer thickness 173 of the conversion layer 110 present in the region of the side faces 143 of the semiconductor chip 140 is greater than a layer thickness 171 of the conversion layer 110 present in the region of the front side 141 of the semiconductor chip 140. As viewed from above, the semiconductor component 100, like the semiconductor chip 140 thereof, may comprise a rectangular or square shape.

Production of semiconductor components 100 comprising the construction shown in FIG. 18 may be carried out in a manner corresponding to the method explained with reference to FIGS. 1 to 6, wherein the semiconductor chips 140 are positioned at greater distances from one another on the conversion layer 110. Possible tolerances when arranging the semiconductor chips 140 on the conversion layer 110 may be compensated for in this way. The greater distances between the semiconductor chips 140 may lead to the design comprising the layer thickness 173 larger than the layer thickness 171 as shown in FIG. 18.

With regard to production of semiconductor components 100 comprising the construction shown in FIG. 18, consideration may furthermore be given to using, to thicken the conversion layer 110 next to and between the semiconductor chips 140, a filling compound 111 additionally comprising a transparent particulate filler. The filling compound 111 may furthermore be diluted with a solvent that evaporates or may be evaporated after application.

Figure 19:
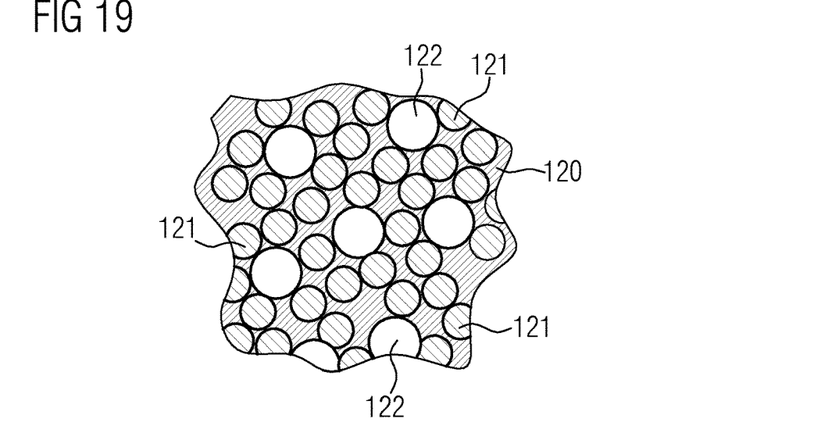
FIG. 19 schematically shows an enlarged illustration of a conversion layer comprising a matrix material, phosphor particles and transparent particles.

In this way, the conversion layer 110 of the semiconductor component 100 shown in FIG. 18 may comprise in the region of the side faces 143 the constitution shown in the enlarged illustration of an excerpt in FIG. 19. In this example, the conversion layer 110 comprises the matrix material 120, phosphor particles 121 and additionally transparent particles 122. In the region of the front side 141, the conversion layer 110 may still comprise the construction without filler as shown in FIG. 17.

In this configuration, the phosphor content in the conversion layer 110 in the region of the front side 141 of the semiconductor chip 140 may correspond to the phosphor content in the conversion layer 110 in the region of the side faces 143 of the semiconductor chip 140, despite the larger layer thickness 173 of the conversion layer 110 in the region of the side faces 143. During radiation operation of the semiconductor component 100, a corresponding radiation conversion may consequently occur at these locations. On account of the transparent particles 122, the conversion layer 110 in the region of the side faces 143 of the semiconductor chip 140 may furthermore comprise a high particle content. In this example, the particle content comprises the phosphor particles 121 and the transparent filler particles 122. The particle content in the conversion layer 110 may be at least 40% or at least 50% in this configuration, too. In FIG. 19, in this sense, a high packing density of the phosphor particles 121 and the transparent particles 122 is indicated, which makes possible efficient heat conduction and hence efficient heat dissipation for the conversion layer 110.

The transparent particles 122 may be, for example, beads comprising a quartz material. Efficient heat dissipation for the conversion layer 110 may be promoted as a result. Alternatively, particles 122 comprising some other transparent material, for example, comprising a glass material may be used.

With regard to the particles 122, it is possible to choose a configuration comprising a transparent material whose refractive index is close to the refractive index of the matrix material 120. In this way, it is possible to avoid an occurrence of increased scattering on account of the particles 122. This may be reliably achieved if the difference in refractive index between the transparent material of the particles 122 and the matrix material 120 is not higher than 0.1, for example, not higher than 0.05.

The method sequences explained with reference to FIGS. 9 to 12 and 13 to 16 may be modified correspondingly such that semiconductor components 100 are formed with a conversion layer 110 comprising a larger layer thickness 173 and additionally transparent particles 122 in the region of the side faces 143 of the associated semiconductor chip 140.

Besides the examples depicted and described above, further examples are possible, which may comprise further modifications and/or combinations of features. It is possible, for example, to use other materials instead of the materials specified above. Moreover, numerical indications above may be replaced by other indications.

With regard to further materials, it is possible, if appropriate, for the filling compound 111 used to thicken the conversion layer 110 additionally to comprise one or more fillers that may be used to define flow, scattering and/or strength properties, for example. A configuration comprising one or a plurality of such fillers may also be considered with regard to the conversion layer 110 provided at the beginning of the method.

A further possible modification of the method consists of carrying out intermediate curing with the aid of a thermal step after providing or applying individual layers or compounds. Such a procedure is possible, for example, with regard to the conversion layer 110 provided at the beginning of the method. In this example, after arranging the semiconductor chips 140, the conversion layer 110 may be subjected to intermediate curing to fix the semiconductor chips 140 on the conversion layer 110. The conversion layer 110 may not be fully cured during the intermediate curing.

Further possible modifications consist of providing different concentrations and/or different types of phosphor particles 121, for example, to generate different conversion radiations, for the conversion layer 110 provided at the beginning of the method and the regions of the conversion layer 110 thickened next to and between the semiconductor chips 140. Furthermore, different matrix materials may be provided for the conversion layer 110 provided at the beginning and the regions of the conversion layer 110 thickened next to and between the semiconductor chips 140.

During production of semiconductor components 100 whose conversion layer 110 comprises a larger layer thickness 173 in the region of the side faces 143 of the semiconductor chip 140 (cf. FIG. 18), it is possible to provide a less active phosphor rather than a filler in the filling compound 111 used to thicken the conversion layer 110. The semiconductor components 100 produced in this way may consequently comprise a less active phosphor in the region of the side faces 143 of the semiconductor chip 140 than in the region of the front side 141 of the semiconductor chip 140. In this example, the conversion layer 110 may comprise a larger phosphor content in the region of the side faces 143 of the semiconductor chip 140 than in the region of the front side 141. What may be achieved by the use of the less active phosphor in the region of the side faces 143 is that a corresponding radiation conversion occurs in the region of the front side 141 and in the region of the side faces 143 of the semiconductor chip 140. In this example, the conversion layer 110 may comprise a high particle content composed exclusively of phosphor particles 121 even in the region of the side faces 143 of the semiconductor chip 140 such that efficient heat dissipation for the conversion layer 110 is possible.

Although our components and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2016 121 099.4, the subject matter of which is incorporated herein by reference.

The invention claimed is:

1. A method of producing radiation-emitting semiconductor components comprising:
providing a conversion layer containing phosphor;
arranging radiation-emitting semiconductor chips on the conversion layer, wherein the semiconductor chips are arranged by a front side on the conversion layer, and the semiconductor chips comprise contacts at a rear side;
thickening the conversion layer next to and between the semiconductor chips by applying a filling compound containing phosphor, wherein the thickened conversion layer adjoins the front side and side faces of the semiconductor chips;
forming a reflective layer on the conversion layer and on the semiconductor chips in a region of the rear side of the semiconductor chips, wherein a rear-side surface of the contacts of the semiconductor chips remains uncovered; and
severing the reflective layer and the conversion layer to form singulated semiconductor components comprising a single semiconductor chip, a part of the conversion layer arranged on the front side and on the side faces of the semiconductor chip, and a part of the reflective layer arranged in the region of the rear side on the semiconductor chip and on the conversion layer.

2. The method according to claim 1, wherein the radiation-emitting semiconductor chips are volume emitting flip-chips.

3. The method according to claim 1, wherein the thickened conversion layer is formed such that a surface of the conversion layer between the semiconductor chips is concavely curved.

4. The method according to claim 1, wherein the filling compound comprises a solvent that evaporates after applying the filling compound.

5. The method according to claim 4, wherein, after applying the filling compound, the conversion layer comprises a planar surface or a concavely curved surface between the semiconductor chips, and the surface of the conversion layer is concavely curved after the solvent has evaporated.

6. The method according to claim 4, wherein, after applying the filling compound, the conversion layer comprises a convexly curved surface between the semiconductor chips, and the surface of the conversion layer is planar after the solvent has evaporated.

7. The method according to claim 1, wherein forming the reflective layer comprises applying a reflective compound on the conversion layer and on the semiconductor chips, and the reflective compound comprises a solvent that evaporates after applying the reflective compound.

8. The method according to claim 1, wherein forming the reflective layer comprises applying a reflective compound on the conversion layer and on the semiconductor chips,
arranging the semiconductor chips, applying the filling compound and applying the reflective compound are each carried out in a state in which the conversion layer is not fully cured, and
curing the reflective layer and the conversion layer is carried out before the severing.

9. The method according to claim 1, wherein the semiconductor components are formed such that a layer thickness of the conversion layer in a region of the front side and related to the front side of the semiconductor chip corresponds to a layer thickness of the conversion layer in a region of the side faces and related to the side faces of the semiconductor chip.

10. The method according to claim 1, wherein the semiconductor components are formed such that a layer thickness of the conversion layer in a region of the side faces and related to the side faces of the semiconductor chip is greater than a layer thickness of the conversion layer in a region of the front side and related to the front side of the semiconductor chip.

11. The method according to claim 1, wherein the filling compound comprises a transparent filler.

12. The method according to claim 1, further comprising at least one of:
the conversion layer is formed such that the conversion layer comprises a volume-related particle content of at least 40%;
the conversion layer and the filling compound comprise a matrix material comprising a refractive index of at least 1.5; and
the conversion layer is provided on an auxiliary carrier.

13. The method according to claim 1, wherein the provided conversion layer is precharacterized before arranging the semiconductor chips.

14. The method according to claim 1, wherein thickening the conversion layer by applying the filling compound is carried out such that the conversion layer completely covers the side faces of the semiconductor chips and extends as far as rear-side edges of the semiconductor chips.

15. A radiation-emitting semiconductor component comprising:
a single radiation-emitting semiconductor chip, wherein the semiconductor chip comprises contacts at a rear side;
a conversion layer containing phosphor and arranged on a front side and on side faces of the semiconductor chip; and
a reflective layer arranged in a region of the rear side on the semiconductor chip and on the conversion layer,
wherein a rear-side surface of the contacts of the semiconductor chip is not covered with the reflective layer,
the semiconductor component comprises phosphor both in a region of the front side and in a region of the side faces of the semiconductor chip due to the conversion layer, and
the conversion layer completely covers the side faces of the semiconductor chip and extends as far as rear-side edges of the semiconductor chip such that the conversion layer does not protrude beyond the rear side of the semiconductor chip.

16. The semiconductor component according to claim 15, wherein, in a region in which the reflective layer adjoins the conversion layer:
the reflective layer comprises an outwardly increasing layer thickness; and
the reflective layer and the conversion layer comprise a curved interface.

17. The semiconductor component according to claim 15, wherein at least one of the conversion layer comprises a volume-related particle content of at least 40%; and
the conversion layer comprises a matrix material comprising a refractive index of at least 1.5.

18. A radiation-emitting semiconductor component comprising:
a single radiation-emitting semiconductor chip, wherein the semiconductor chip comprises contacts at a rear side;
a conversion layer containing phosphor and arranged on a front side and on side faces of the semiconductor chip; and
a reflective layer arranged in a region of the rear side on the semiconductor chip and on the conversion layer,
wherein a rear-side surface of the contacts of the semiconductor chip is not covered with the reflective layer,
the semiconductor component comprises phosphor both in a region of the front side and in a region of the side faces of the semiconductor chip due to the conversion layer,
the conversion layer comprises a matrix material and phosphor particles,
a layer thickness of the conversion layer in the region of the side faces that is related to a thickness extension of the conversion layer starting from each of the side faces of the semiconductor chip is greater than a layer thickness of the conversion layer in the region of the front side that is related to a thickness extension of the conversion layer starting from the front side of the semiconductor chip,
the conversion layer additionally comprises a transparent particulate filler in the region of the side faces of the semiconductor chip, and
the transparent particulate filler comprises transparent filler particles.

19. The semiconductor component according to claim 18, wherein the conversion layer is configured without the transparent particulate filler in the region of the front side of the semiconductor chip.

20. The semiconductor component according to claim 18, wherein the reflective layer and the conversion layer comprise a curved interface in a region in which the reflective layer adjoins the conversion layer.

* * * * *